United States Patent
Wang et al.

(10) Patent No.: US 10,163,877 B2
(45) Date of Patent: Dec. 25, 2018

(54) SYSTEM IN PACKAGE PROCESS FLOW

(75) Inventors: Tsung-Ding Wang, Tainan (TW); Chien-Hsiun Lee, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 524 days.

(21) Appl. No.: 13/290,208

(22) Filed: Nov. 7, 2011

(65) Prior Publication Data
US 2013/0113115 A1    May 9, 2013

(51) Int. Cl.
*H01L 25/11* (2006.01)
*H01L 23/31* (2006.01)
(Continued)

(52) U.S. Cl.
CPC .......... *H01L 25/112* (2013.01); *H01L 21/563* (2013.01); *H01L 23/145* (2013.01);
(Continued)

(58) Field of Classification Search
CPC ..... H01L 2224/16237; H01L 23/49827; H01L 24/73; H01L 21/563; H01L 24/97; H01L 25/0652; H01L 23/49816; H01L 21/561; H01L 23/3114; H01L 23/3128; H01L 23/3135; H01L 25/0655; H01L 25/0657; H01L 25/071; H01L 25/072; H01L 25/074; H01L 25/117; H01L 25/112; H01L 25/115; H01L 2224/1403; H01L 2224/14051; H01L 2224/14104; H01L 2224/14131; H01L 2224/14132; H01L 2224/14135; H01L 2224/14136; H01L 2224/14165; H01L 2224/14166; H01L 2224/14179; H01L 2224/14181; H01L 2224/16014; H01L 2224/16055; H05K 2201/10;
(Continued)

(56) References Cited

U.S. PATENT DOCUMENTS 6,731,009 B1* 5/2004 Jones ................. H01L 25/0657
257/686
7,518,224 B2* 4/2009 Shim .................. H01L 23/3128
257/678
(Continued)

OTHER PUBLICATIONS

Brunnbauer M. et al., "An Embedded Device Technology Based on a Molded Reconfigured Wafer", Electronic Components and Technology Conference, 2006, pp. 547-551.
(Continued)

*Primary Examiner* — Sophia Nguyen
(74) *Attorney, Agent, or Firm* — Duane Morris LLP

(57) ABSTRACT

A method comprises connecting a substrate having a plurality of integrated circuit (IC) dies to a package substrate, so that the package substrate extends beyond at least two edges of the substrate, leaving first and second edge portions of the package substrate having exposed contacts. The first and second edge portions meet at a first corner of the package substrate. At least a first upper die package is placed over the substrate, so that first and second edge portions of the first upper die package extend beyond the at least two edges of the substrate. Pads on the first and second edge portions of the first upper die package are connected to the contacts of the first and second edge portions of the package substrate.

20 Claims, 15 Drawing Sheets

(51) Int. Cl.
*H01L 25/03* (2006.01)
*H01L 23/14* (2006.01)
*H01L 23/498* (2006.01)
*H01L 21/56* (2006.01)
*H05K 3/40* (2006.01)
*H01L 25/07* (2006.01)
*H01L 25/065* (2006.01)
*H01L 23/00* (2006.01)
*H01L 25/00* (2006.01)

(52) U.S. Cl.
CPC .... *H01L 23/3114* (2013.01); *H01L 23/49816* (2013.01); *H01L 24/97* (2013.01); *H01L 25/03* (2013.01); *H01L 25/0652* (2013.01); *H01L 25/115* (2013.01); *H01L 25/117* (2013.01); *H01L 23/3128* (2013.01); *H01L 23/49822* (2013.01); *H01L 23/49827* (2013.01); *H01L 24/13* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 24/92* (2013.01); *H01L 25/0655* (2013.01); *H01L 25/0657* (2013.01); *H01L 25/071* (2013.01); *H01L 25/074* (2013.01); *H01L 25/50* (2013.01); *H01L 2224/131* (2013.01); *H01L 2224/14132* (2013.01); *H01L 2224/14165* (2013.01); *H01L 2224/14179* (2013.01); *H01L 2224/16225* (2013.01); *H01L 2224/16237* (2013.01); *H01L 2224/2919* (2013.01); *H01L 2224/32145* (2013.01); *H01L 2224/32225* (2013.01); *H01L 2224/73203* (2013.01); *H01L 2224/73204* (2013.01); *H01L 2224/73253* (2013.01); *H01L 2224/8191* (2013.01); *H01L 2224/81191* (2013.01); *H01L 2224/81192* (2013.01); *H01L 2224/81193* (2013.01); *H01L 2224/81447* (2013.01); *H01L 2224/81815* (2013.01); *H01L 2224/83385* (2013.01); *H01L 2224/92125* (2013.01); *H01L 2224/97* (2013.01); *H01L 2225/06517* (2013.01); *H01L 2225/06562* (2013.01); *H01L 2225/06589* (2013.01); *H01L 2924/14* (2013.01); *H01L 2924/1436* (2013.01); *H01L 2924/1437* (2013.01); *H01L 2924/15311* (2013.01); *H01L 2924/15331* (2013.01); *H01L 2924/15747* (2013.01); *H01L 2924/181* (2013.01); *H01L 2924/18161* (2013.01); *H05K 3/403* (2013.01)

(58) Field of Classification Search
CPC ........... H05K 2203/041; H05K 3/3442; H05K 3/3436; H05K 3/403; H05K 3/4623
USPC .................................................. 257/777, 778
See application file for complete search history.

(56) References Cited

U.S. PATENT DOCUMENTS

| | | | | |
|---|---|---|---|---|
| 7,746,656 B2* | 6/2010 | Shim | ................... | H01L 23/3128 174/260 |
| RE41,869 E * | 10/2010 | Kawashima et al. | ......... | 257/678 |
| 7,872,340 B2* | 1/2011 | Choi | ................... | H01L 24/81 257/686 |
| 8,064,224 B2* | 11/2011 | Mahajan | ................. | H01L 24/16 257/E21.499 |
| 8,080,874 B1* | 12/2011 | Werner | ................ | H01L 25/105 257/686 |
| 8,163,600 B2* | 4/2012 | Chow | ................ | H01L 23/3128 257/686 |
| 8,227,904 B2* | 7/2012 | Braunisch | ............... | H01L 23/13 257/686 |
| 8,405,207 B1* | 3/2013 | Crisp | ................ | H01L 23/49816 257/724 |
| 8,896,126 B2* | 11/2014 | Setardja | ................... | H01L 23/13 257/685 |
| 9,053,949 B2* | 6/2015 | Lin | ........................ | H01L 23/367 |
| 9,418,926 B1* | 8/2016 | Fay | ...................... | H01L 23/49827 |
| 9,741,664 B2* | 8/2017 | Chiu | .................... | H01L 23/5381 |
| 9,859,181 B2* | 1/2018 | Lin | ........................ | H01L 23/18 |
| 2002/0168797 A1 | 11/2002 | DiStefano et al. | | |
| 2004/0145054 A1* | 7/2004 | Bang et al. | .................... | 257/737 |
| 2004/0222534 A1* | 11/2004 | Sawamoto | .............. | H01L 21/56 257/778 |
| 2004/0245617 A1 | 12/2004 | Damberg et al. | | |
| 2006/0208348 A1* | 9/2006 | Ohsaka | .................... | H01L 24/97 257/685 |
| 2007/0069371 A1* | 3/2007 | Iksan | ................ | H01L 25/0657 257/706 |
| 2007/0096160 A1* | 5/2007 | Beroz et al. | .................. | 257/232 |
| 2007/0096291 A1* | 5/2007 | Kawabata et al. | ............ | 257/700 |
| 2008/0230883 A1* | 9/2008 | Yee | ........................ | H01L 21/561 257/678 |
| 2009/0057864 A1* | 3/2009 | Choi | ........................ | H01L 24/81 257/686 |
| 2009/0079067 A1* | 3/2009 | Gerber | .................. | H01L 23/481 257/737 |
| 2009/0089466 A1* | 4/2009 | Cunningham | .......... | H01L 23/48 710/100 |
| 2009/0152692 A1* | 6/2009 | Chow | ................... | H01L 21/565 257/668 |
| 2009/0179319 A1* | 7/2009 | Lee | .............. | 257/686 |
| 2009/0243070 A1 | 10/2009 | Ko et al. | | |
| 2009/0267238 A1* | 10/2009 | Joseph | .............. | H01L 23/49833 257/777 |
| 2010/0013101 A1* | 1/2010 | Hedler | .................. | H01L 21/561 257/773 |
| 2010/0019382 A1* | 1/2010 | Miwa | ................... | H01L 23/49838 257/737 |
| 2010/0213600 A1* | 8/2010 | Lau | ........................ | H01L 23/055 257/693 |
| 2010/0230825 A1* | 9/2010 | von Kaenel | ....... | H01L 23/49816 257/777 |
| 2011/0042798 A1* | 2/2011 | Pagaila | .................. | H01L 21/568 257/692 |
| 2011/0062599 A1* | 3/2011 | Kim | ................... | H01L 23/49816 257/778 |
| 2011/0089563 A1* | 4/2011 | Kikuchi et al. | ................ | 257/738 |
| 2011/0095418 A1* | 4/2011 | Lim | .................... | H01L 23/3128 257/737 |
| 2011/0175218 A1* | 7/2011 | Liou | .................... | H01L 23/147 257/712 |
| 2011/0227209 A1* | 9/2011 | Yoon | .................. | H01L 23/3128 257/686 |
| 2011/0233764 A1* | 9/2011 | Chang | .................... | H01L 21/563 257/737 |
| 2012/0267796 A1* | 10/2012 | Haba | ........................ | H01L 23/50 257/777 |
| 2012/0326282 A1* | 12/2012 | Sutardja | ................... | H01L 25/0652 257/621 |
| 2013/0015590 A1* | 1/2013 | Haba | .................... | H01L 25/0652 257/778 |
| 2013/0015591 A1* | 1/2013 | Haba | ........................ | H01L 24/06 257/778 |
| 2013/0032937 A1* | 2/2013 | Lin | ........................ | H01L 23/367 257/706 |
| 2013/0043587 A1* | 2/2013 | Kao | ........................ | H01L 24/73 257/738 |
| 2013/0056880 A1* | 3/2013 | Wang | .................... | H01L 23/145 257/777 |
| 2013/0105993 A1* | 5/2013 | Bahadur | .................. | H01L 24/11 257/782 |
| 2013/0187292 A1* | 7/2013 | Semmelmeyer | .... | H01L 25/0652 257/777 |
| 2013/0200529 A1* | 8/2013 | Lin | ................... | H01L 23/49827 257/777 |

(56) References Cited

U.S. PATENT DOCUMENTS

| | | | |
|---|---|---|---|
| 2014/0042623 A1* | 2/2014 | Wang | H01L 23/145 |
| | | | 257/738 |
| 2014/0073071 A1* | 3/2014 | Diorio | G06K 19/0723 |
| | | | 438/26 |
| 2014/0124921 A1* | 5/2014 | Lee | H01L 23/16 |
| | | | 257/737 |
| 2015/0061101 A1* | 3/2015 | Le | H01L 25/0655 |
| | | | 257/676 |
| 2015/0236003 A1* | 8/2015 | Konno | H01L 25/50 |
| | | | 438/107 |
| 2015/0262898 A1* | 9/2015 | Chen | H01L 22/32 |
| | | | 257/48 |
| 2016/0056087 A1* | 2/2016 | Wu | H01L 21/486 |
| | | | 257/738 |
| 2017/0110407 A1* | 4/2017 | Chaware | H01L 23/538 |
| 2018/0005987 A1* | 1/2018 | Hiner | H01L 23/5383 |
| 2018/0090465 A1* | 3/2018 | Chen | H01L 21/4857 |

OTHER PUBLICATIONS

Yuan, T.D. et al., "Thermal Interface Material (TIM) Design Guidance for Flip Chip BGA Package Thermal Performance", Oct. 2004, 6 pages, www.altera.com/literature/cp/cp-01020.

* cited by examiner

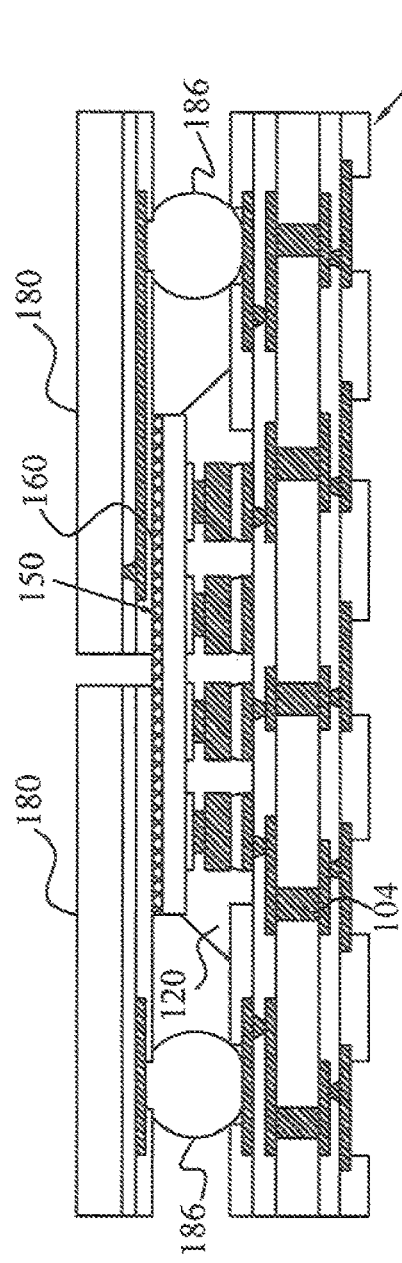
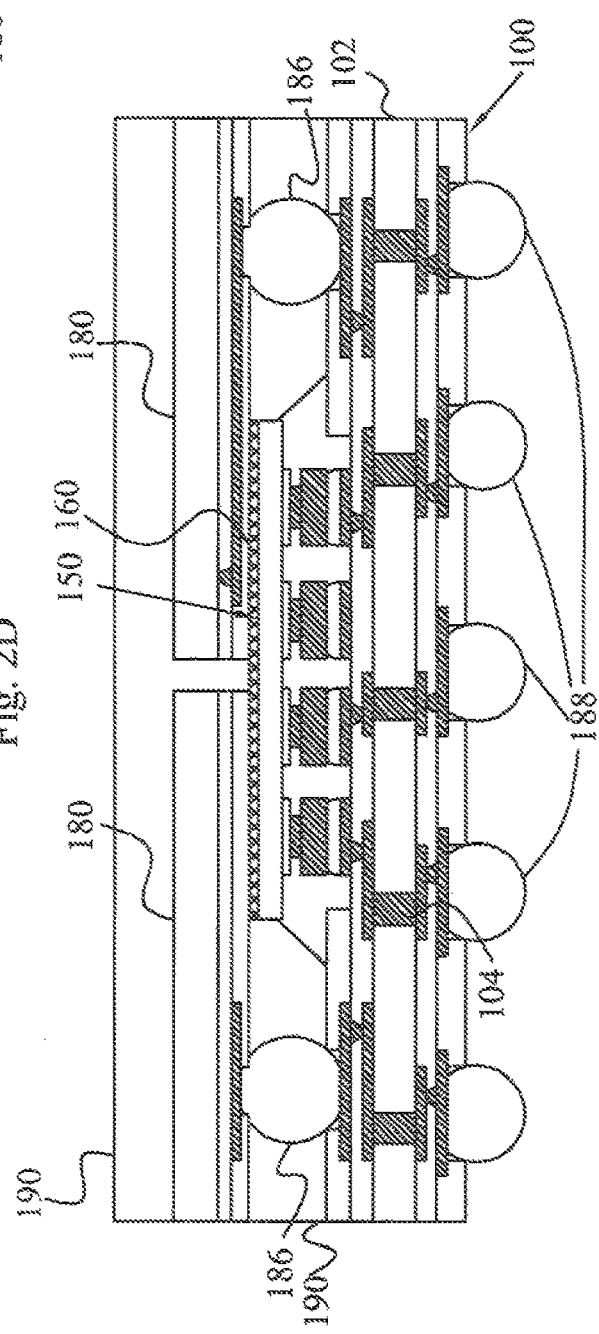
Fig. 2D
Fig. 2E

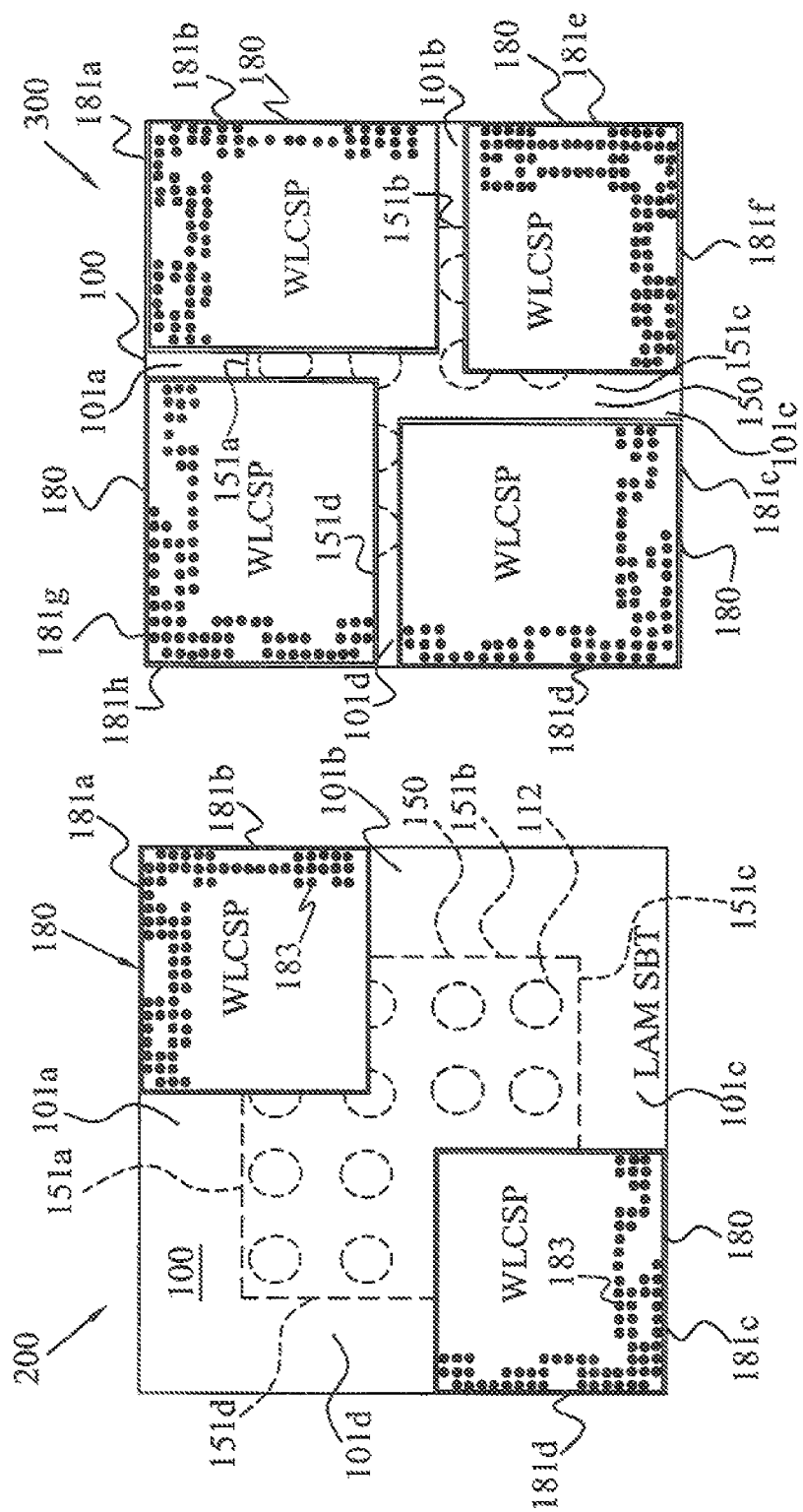

SYSTEM IN PACKAGE PROCESS FLOW

FIELD

This disclosure relates to semiconductor integrated circuits (ICs) and methods for packaging the ICs.

BACKGROUND

As the semiconductor industry continues to reduce package dimensions, foundries are looking to increase vertical density in addition to horizontal circuit density. 3D packaging saves space by stacking separate chips in a single package. This packaging, known as System in Package (SiP), uses off-chip signaling (e.g., by way of conductive paths in the package substrate) for communication between chips in the package The chips are not integrated into a single circuit. Rather, the chips within in the package communicate as though they are mounted in separate packages on a normal circuit board. For example, both the upper and lower chips may be wire bonded to the package substrate.

BRIEF DESCRIPTION OF THE DRAWINGS

FIGS. 2A to 2F are cross sectional views showing various stages of a method of fabricating a System in Package according to one embodiment.

FIGS. 3A and 3B are top plan views of the package shown in FIG. 2F.

DETAILED DESCRIPTION

Figure 1A:
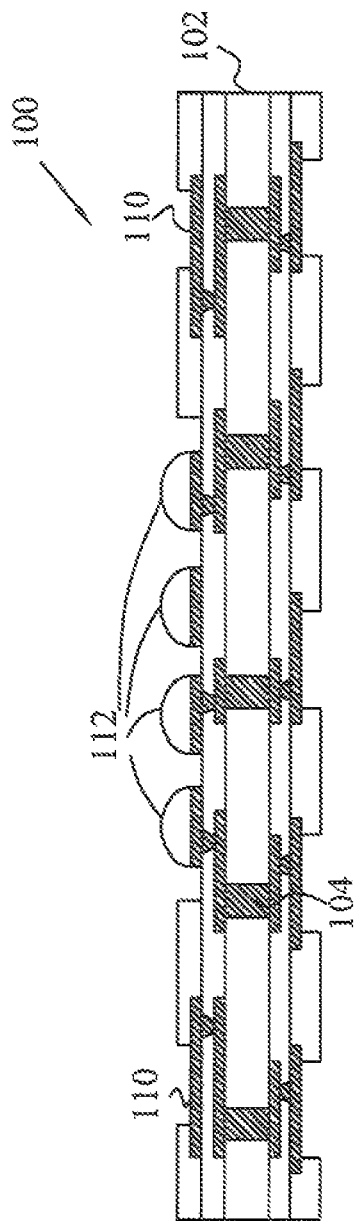
FIG. 1A is a cross sectional view of a package substrate.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The drawings are not drawn to scale.

Figure 1C:
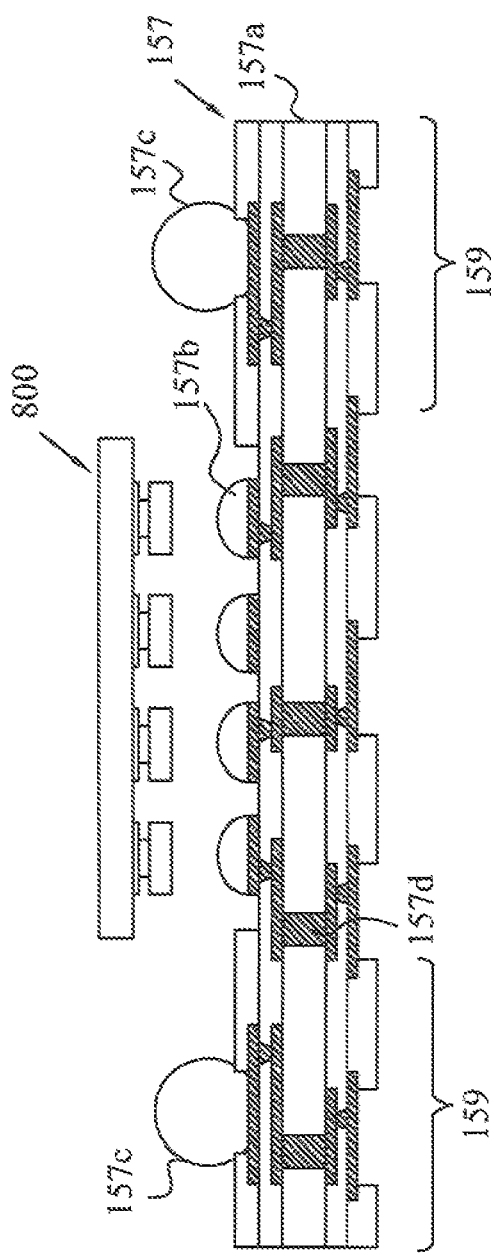
FIG. 1C shows a side cross sectional view of one of the die mounting regions of FIG. 1B, with a bottom die being mounted thereon.
Figure 2A:
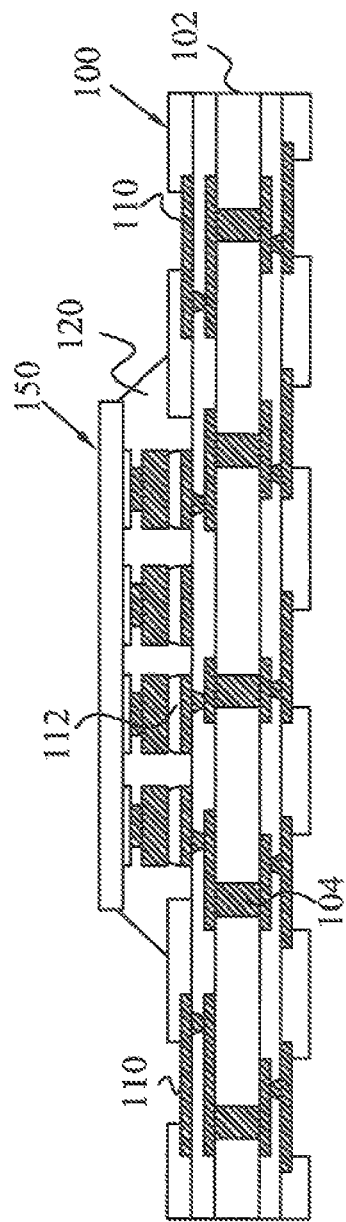
Figure 2B:
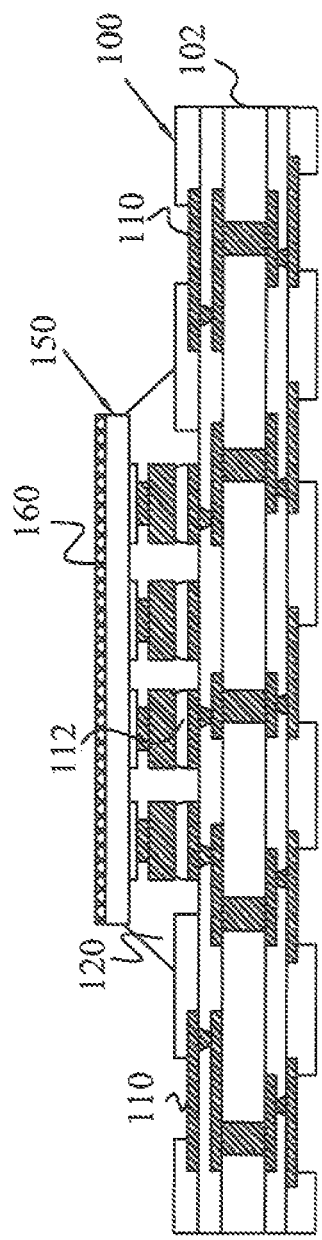
Figure 2C:
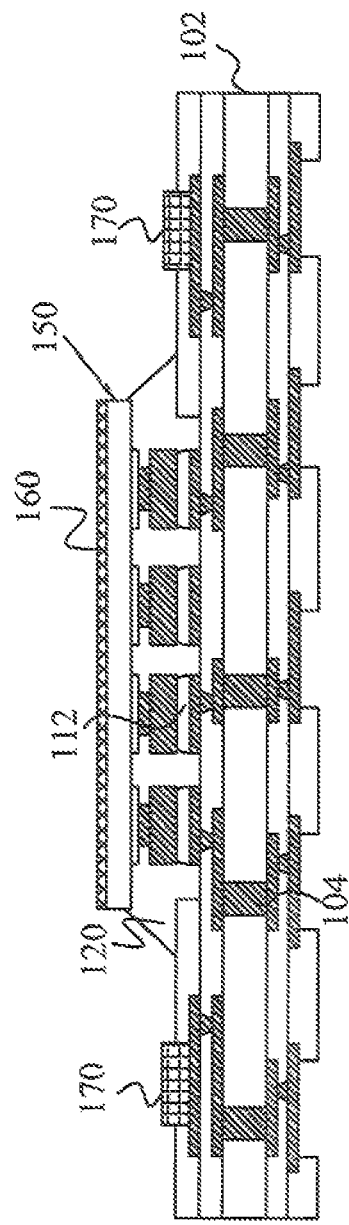
Figure 2F:
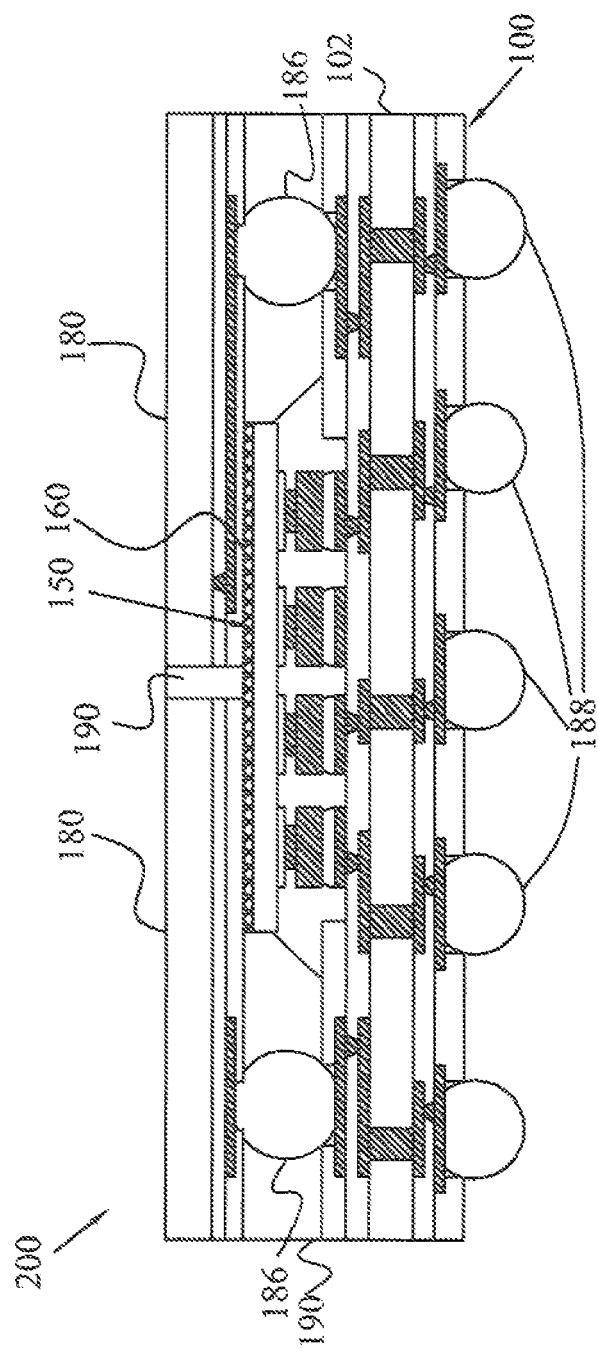

FIGS. 2F and 3A show a first embodiment of an integrated circuit (IC) package 200. FIGS. 1A, 1C (800 bottom die) and 1E show the major components included in the package 200. (or say, 100, 800 and 180 show the major components included in the package 200.)

FIG. 1A shows a package substrate 100. The package substrate 100 comprises a package substrate dielectric layer 102 which may be made from a dielectric such as FR-4 (Woven glass and epoxy), or other prepreg materials such as FR-2 (Phenolic cotton paper), FR-3 (Cotton paper and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), CEM-5 (Woven glass and polyester). In other embodiments, the package substrate dielectric layer 102 may be made from polytetrafluoroethylene.

Package substrate 100 has a plurality of conductive patterns and vias, collectively labeled 104, for distributing signals and power between the ICs above and the solder balls 188 below. On the top surface of package substrate 100, a plurality of solder balls or bumps 112 are provided for connections between the package substrate 100 and a substrate 150 (shown in FIG. 1B). In alternative embodiments, instead of solder 112, the substrate 100 may have bare pads (e.g., copper pads), for interconnection with a die flip-chip mounted above the substrate). A plurality of pads 110 are provided for connections between the package substrate 100 and an upper die package 180 (shown in FIG. 1E).

Figure 1B:
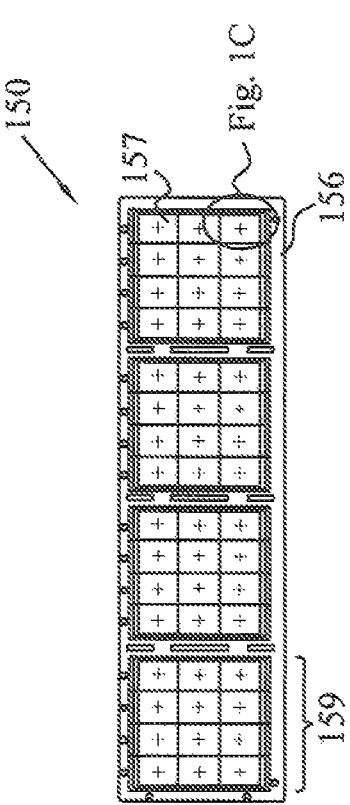
FIG. 1B is a top plan view of a substrate.

In FIG. 1B, a substrate design assembly 150 provides the main package substrate. The die mounting region 157 includes a portion of the substrate 157a, with solder bumps 157b on contacts for connecting a bottom die 800 (shown in FIG. 1C). One substrate 150 may have many die bonding areas 157, grouped in blocks 159. In some embodiments, the substrate 150 has one to four blocks 159. Every block 159 may have from 9 to 20 bonding areas for bottom dies 800.

FIG. 1C is a side cross section view of one of the die mounting regions 157 of FIG. 1B, and is representative of all of the regions. A respective die 800 is connected to substrate 150 in each respective one of the die mounting regions 157. The substrate 150 includes additional bumps 157c for connecting top dies 180 above the bottom die 800. The bumps 157c are arranged around the perimeter of the die mounting region 157, so as to be exposed after die 800 is mounted on the substrate. Although not shown in FIG. 1C, a TIM 160 (as shown in FIG. 2B) is provided over the bottom die 800.

Figure 1D:
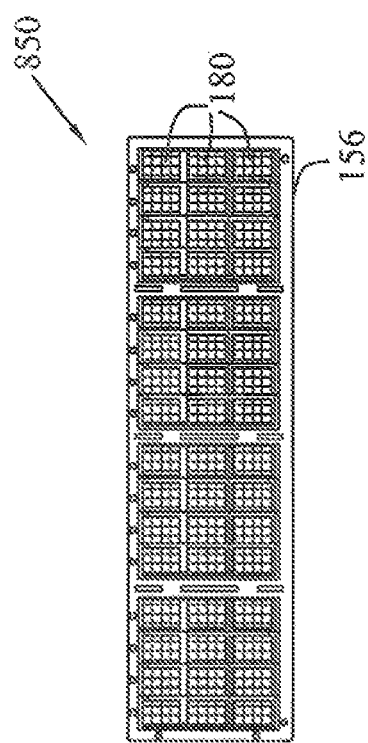
FIG. 1D is a plan view of the substrate of FIG. 1B, after the bottom dies are mounted thereon.

Next, as shown in FIG. 1D, a plurality of top dies 180 are mounted over the bottom dies 800. The top dies 180 may be wafer level chip scale packages (WLCSP, as described above) to join the bottom dies and substrate together, and the assembly 850 is encapsulated with an encapsulant (e.g., molding compound) to complete the package-on-package, (PoP) assembly 850, shown in FIG. 1D. In some embodiments, one top die 180 is mounted over each bottom die 800. In other embodiments, two or four top dies 180 are mounted over the bottom dies 800, in configurations as shown in FIGS. 3A and 3B. Thus, substrate 150 may serve as the package substrate of the PoP assembly 850, and a separate package substrate (e.g., 102 in FIG. 2A) is not included.

Thus, FIG. 1D shows an integrated circuit (IC) package 850 comprising a substrate 150 having a plurality of bottom dies 800 connected to the substrate 150, so that first and second connecting portions 159 of the substrate 150 extend beyond at least two edges of each bottom die 800, the first and second connecting portions 159 meeting at a first corner of each bottom die 800. at least a first upper die package 180 is positioned over at least one of the bottom dies 800, so that first and second edge portions of the first upper die package 180 extend beyond the at least two edges of at least one of the bottom dies 800. The first upper die package 180 has pads on the first and second edge portions thereof (as described above). The pads are connected to the contacts of the first and second connecting portions 159 of the substrate 150 by solder 157c.

Although the configuration of FIG. 3B shows four top dies 180 per substrate 150, the configuration of FIG. 1D may have many more top dies 180. For example, FIG. 1D shows 48 top dies 180 above one substrate 150. The configuration of FIG. 1D also differs from that shown in FIG. 2F in that, in FIG. 1D, the top dies 180 are mounted above the front face of the substrate 150 (i.e., the face having the bumps for connecting dies to the substrate 150). In the configuration of FIG. 2F, on the other hand, the top dies 180 are mounted above the back face of the substrate 150.

FIG. 1D shows a substrate 150 having a plurality of IC dies 800 connected to a substrate package substrate 156. One substrate 150 may have many bond areas for bonding respective IC dies 800 onto the substrate 150. The substrate 150 may be, for example, any of the packages described in U.S. Patent Application Publication No. US 2008/0230883 A1, which is incorporated by reference herein in its entirety. The substrate 150 includes an in-line, such as a copper lead frame array (not shown). The in-line includes individual units 800, having in-line rails 156 such as guide rails or side rails. The in-line rails 156 guide the in-line 150 in feeding the in-line 150 into processing equipment or handling equipment.

The package substrate 100 and substrate 150 are sized, so that first and second edge portions 101a, 101b of the package substrate 100 extend beyond at least two edges 151a, 151b (shown in FIG. 3A) of the substrate 150, where the first and second edge portions 101a, 101b meet at a first corner of the package substrate 100. In FIG. 3A, edges 151a-151d are shown in phantom, indicating that the edges 151a-151d are hidden beneath the exposed surface of the package.

Figure 1E:
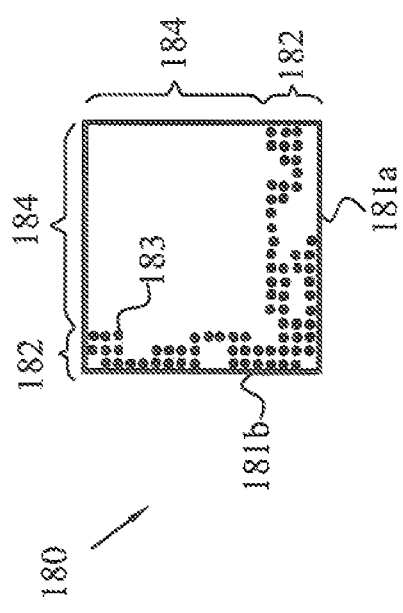
FIG. 1E is a bottom plan view of a wafer level chip scale package.

FIG. 1E shows an upper die package 180, which may be a wafer level chip scale package. At least one upper die package 180 is provided. Various embodiments may include one, two, three or four upper die packages 180 depending on the number of functions to be performed, or amount of storage to be provided, by the upper die package configuration. For example, the at least one upper die package can include one or more of the group consisting of a general purpose processor (e.g., a system on chip or SoC), a graphics processor, an audio/video processor, a digital radio receiver, DRAM, SRAM, or flash memory, a communications processor (which may include a WiFi (802.11), Bluetooth, or broadband interface), a global positioning satellite (GPS) receiver, or other communications interface; a second processor and a power management unit.

The first upper die package 180 has pads 183 on the first and second abutting edge portions 182 thereof. The first and second edge portions 182 form an L shaped region along two side edges 181a, 181b of the first upper die package 180. In some embodiments, the first upper die package 180 has solder balls 186 on the pads 183. In other embodiments, the first upper die package has pads 183 without solder balls. A second region 184 of the first upper die package 180 has no pads. The second region 184 is adapted to be used as a mounting interface surface.

At least the first upper die package 180 is to be positioned over the substrate 150, so that first and second edge portions 181a, 181b of the first upper die package 180 extend beyond the at least two edges 151a, 151b of the substrate 150. A thermal interface material 160 is positioned between the substrate 150 and the second region 184 of the first upper die package 180. The thermal interface material 160 (optional) may be a soft polymer, such as a polyimide, or air only.

In the final package configuration of FIG. 2F, the pads 183 are connected to the contacts 110 of the first and second edge portions 101a, 101b of the package substrate 100 by solder 186.

FIG. 3A shows an optional second upper die package 180. The package substrate 100 extends beyond third and fourth edges 151c, 151d of the substrate 150 opposite the first and second edges 151a, 151b of the substrate 100. The third and fourth edge portions 181c, 181d of the second upper die package 180 extend beyond third and fourth edges of the substrate 150. The third and fourth edge portions 151c, 151d of the second upper die package 150 have pads connected to the contacts of the third and fourth edge portions 101c, 101d of the package substrate 100.

In FIG. 3A, the two upper die packages 180 are shown as being of the same size. This is optional. In some embodiments, the first and second upper die packages 180 are configured identically to each other, for example to provide two DRAM packages.

In other embodiments (such as shown in FIG. 3B), the upper die packages may be of different sizes, and may contain different types of ICs for performing distinct functions. In the embodiment 300 of FIG. 3B, the first, second, third and fourth upper die packages 180 are wafer level chip scale packages.

As shown in FIG. 3B, a third upper die package 180 may optionally be provided over the substrate 150, having fifth and sixth edge portions 181e, 181f of the third upper die package extending beyond the second and third edges 151b, 151c of the substrate, the fifth and sixth edge portions 181e, 181f of the third upper die package having pads 183 connected to the contacts 110 of the second and third edge portions 101b, 101c of the package substrate 100. A fourth upper die package 180 over the substrate 150 has seventh and eighth edge portions 181g, 181h of the fourth upper die package extending beyond the first and fourth edges 151a, 151d of the substrate 150. The seventh and eighth edge portions 181g, 181h of the fourth upper die package 180 have pads 183 connected to the contacts 110 of the first and fourth edge portions 101a, 101d of the package substrate 100.

Figure 7:
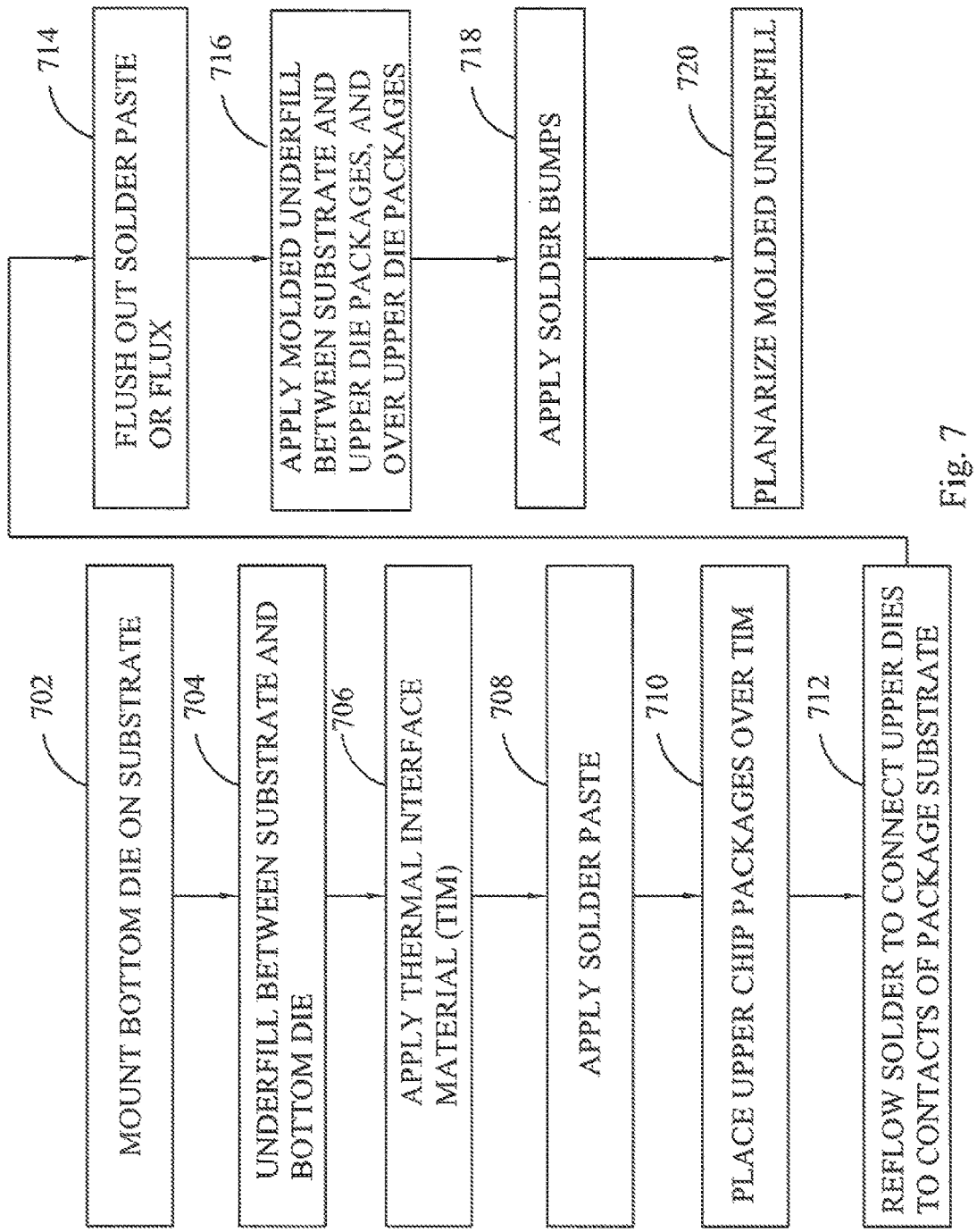
FIG. 7 is a flow chart of an SiP packaging method.

FIGS. 2A to 2F show a first example of a method for fabricating the package 200. FIG. 7 is a flow chart of the method At step 702, a substrate 150 having a plurality of integrated circuit (IC) dies 800 is connected to a package substrate 100, so that the package substrate 100 extends beyond at least two edges 151a, 151b of the substrate 150, leaving first and second edge portions 101a, 101b of the package substrate having contacts thereon exposed, where the first and second edge portions 101a, 101b meet at a first corner of the package substrate. In the example of FIG. 2A, third and fourth edge portions 101c, 101d of the package substrate 100 are also exposed. The substrate 150 is mounted to the package substrate 100. The substrate 150 is positioned so that the pads of the substrate 150 confront the solder balls 112 of the package substrate 100. The assembly is heated to reflow the solder balls 112, forming the electrical connections to the conductive patterns and vias 104 of the package substrate 100.

At step 704, a first underfill material 120 is flowed into the space between the package substrate and the substrate 150. The resulting configuration is as shown in FIG. 2A.

At step 706, as shown in FIG. 2B, a thermal interface material (TIM) 160 is placed over the back surface of the substrate 150. The TIM 160 may be printed or stenciled onto the dies 150 or applied as a TIM film, so that the substrate is covered, but the contacts 110 of edge portions 101a-101d of the package substrate remain exposed.

At step 708, as shown in FIG. 2C, a solder paste 170 is deposited on the contacts 110 of edge portions 101a-101d of the package substrate 100. The solder paste 170 may be defined by stencil or deposited by a solder jet.

At step 710, as shown in FIG. 2D, at least a first upper die package 180 is placed over the substrate 150, so that first and second edge portions 181a, 181b of the first upper die package 180 extend beyond the at least two edges 151a, 151b of the substrate 150. The portion 184 of the first upper die 150 having no pads 183 at least partially overlies the substrate 150, and directly contacts the TIM 160. Thus, the first upper die partly overlies and extends beyond the corner of the substrate 150.

In the example of FIG. 2D, at least two upper die packages 180 are placed over the substrate 150. The package substrate 100 extends beyond third and fourth edges 151c, 151d of the substrate 150 opposite the at least two edges 151a, 151b of the substrate, leaving third and fourth edge portions 101c, 101d of the package substrate 100 having contacts 110 thereon exposed. A second upper die package 180 is placed over the substrate 150, so that third and fourth edge portions 181c, 181d of the second upper die package 180 extend beyond the third and fourth edges 151c, 151d of the substrate 150. The bare surface portions 184 of the upper die packages 180 directly confront the TIM material 160 and pressure is applied to eliminate any air gaps, thus ensuring good thermal conductance between the substrate 150 and the upper die packages 180.

At step 712, the pads 183 on the first and second edge portions 181a, 181b of the first upper die package 180 are connected to the contacts 110 of the first and second edge portions 101a, 101b of the package substrate 100. The pads 183 on the third and fourth edge portions 101c, 101d of the second upper die package 180 are connected to the contacts 110 of the third and fourth edge portions 101c, 101d of the package substrate 100. In the method of FIGS. 2A-2F, the upper die packages 180 are provided with solder balls 186, copper posts, or conductive spacers on the pads 183. The electrical and mechanical connections are made by heating the assembly to reflow the solder balls 186.

At step 714, the assembly is cleaned, for example by flushing with deionized water, to remove any remaining solder paste and/or flux.

At step 716, as shown in FIG. 2E, a molded underfill material 190 is applied around the solder 186 and substrate 150, and above the first and second upper die packages 180, filling the space between the substrate 150 and the package substrate 100.

At step 718, solder bumps 188 are applied to the package 100.

In some embodiments, the package is completed at the end of step 2E

In other embodiments, the package 200 is thinned by a planarization process (step 720), to remove the portion of the molding compound 190 above the back faces of the upper die packages 180, as shown in FIG. 2F. Optionally, the package 200 may be thinned further, to remove more material from the back face of the upper die packages 180 and thin the die packages 180. Removal of the molding compound material 190 above the upper die packages and optionally thinning the upper die packages improves the thermal performance of the IC package 200.

Although the method of FIGS. 2A-2F is described above with reference to an embodiment having two upper die packages 180 (as shown in FIG. 3A), FIGS. 2A-2F also show the process used for an assembly having three or four upper die packages (as shown in FIG. 3B) or one die package. The method is the same, except that in step 710, three or four upper dies 180 are placed in FIG. 2D, instead of two upper dies, and the solder for the third and fourth upper dies is reflowed at step 712.

Thus, step 710 includes placing a third upper die package 180 over the substrate 150, so that fifth and sixth edge portions 181e, 181f of the third upper die package extend beyond the second and third edges 151b, 151c of the substrate; and placing a fourth upper die package over the substrate, so that the seventh and eighth edge portions 181g, 181h of the fourth upper die package extend beyond the first and fourth edges 151a, 151d of the substrate. In this embodiment, step 712 further includes connecting pads on the fifth and sixth edge portions 181e, 181f of the third upper die package to the contacts 110 of the second and third edge portions 101b, 101c of the package substrate; and connecting pads on the seventh and eighth edge portions 181g, 181h of the fourth upper die package to the contacts 110 of the first and fourth edge portions 101a, 101b of the package substrate 100.

FIG. 7 shows one sequence for performing the packaging steps. The sequence of performing the various steps shown in FIG. 7 may be altered. Three alternative sequences are described below.

Figure 4A:
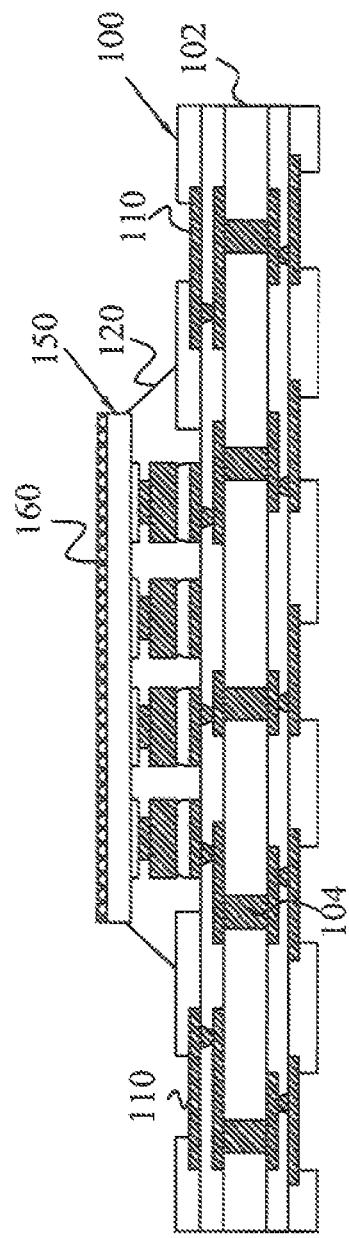
FIGS. 4A-4D are cross sectional views showing various stages of a method of fabricating a System in Package according to a second embodiment.
Figure 4B:
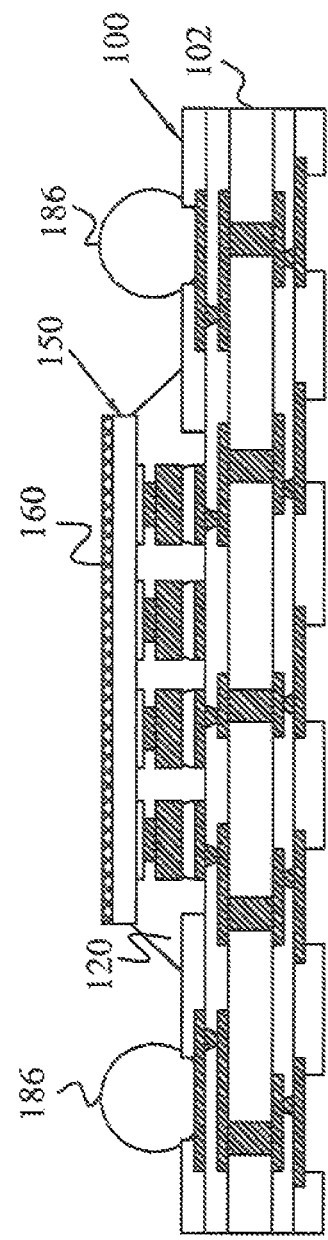
Figure 4C:
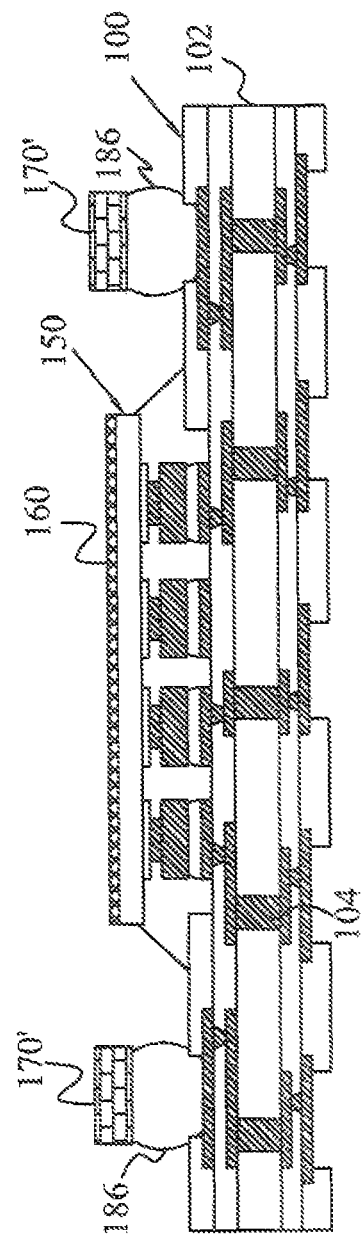

FIGS. 4A to 4C show a variation of the fabrication method.

In FIG. 4A, the assembly shown in FIG. 2B is provided. The steps performed to provide this assembly are described above, and for brevity the description is not repeated.

In FIG. 4B, the solder balls 186 are placed on the contacts 110 of edge portions 101a-101d of substrate 100, and reflowed to join the solder balls and contacts 110.

In FIG. 4C, the solder paste 170' is applied over the solder balls (as opposed to solder paste 170 under the solder balls in FIG. 2C). The solder paste 170' may be printed on the solder balls 186, for example.

Figure 4D:
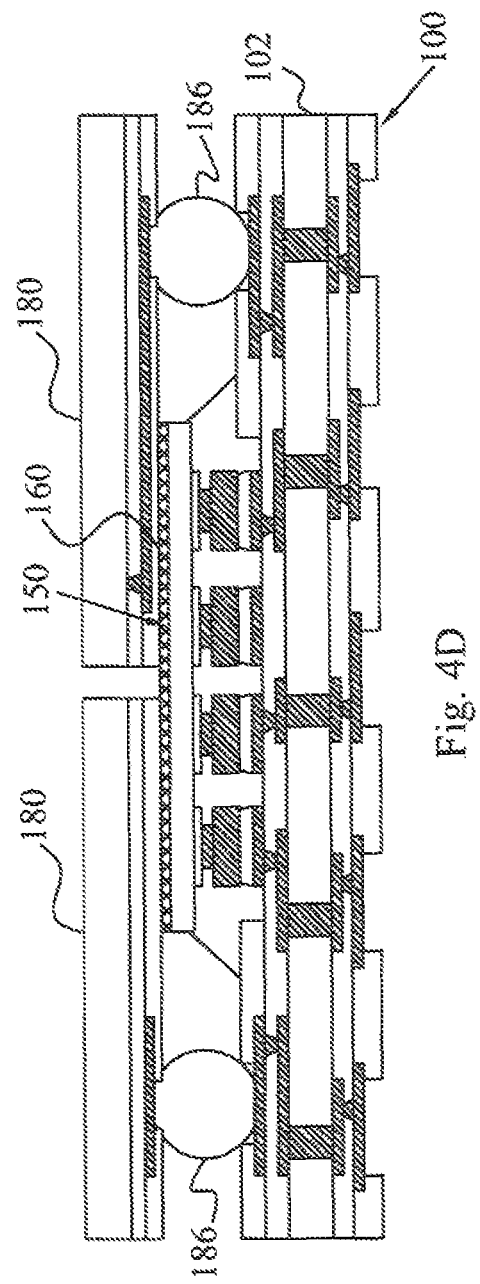

In FIG. 4D, at least a first upper die package 180 is placed over the substrate 150, so that first and second edge portions 181a, 181b of the first upper die package 180 extend beyond the at least two edges 151a, 151b of the substrate 150. In FIG. 4D, two, three or four upper die packages 180 are provided, for example in the configurations shown in FIG. 3A or 3B, as described above. The assembly is heated (as described above with reference to FIG. 2D), reflowing the solder balls to mechanically and electrically connect the front side pads 183 of the upper die packages 180 to the contacts 110 of the package substrate 100.

The assembly shown in FIG. 4D is then encapsulated by molding compound (as shown and described with reference to FIG. 2E), and the package is optionally thinned as shown and described above with reference to FIG. 2F.

FIGS. 5A to 5D show another variation of the assembly method.

Figure 5A:
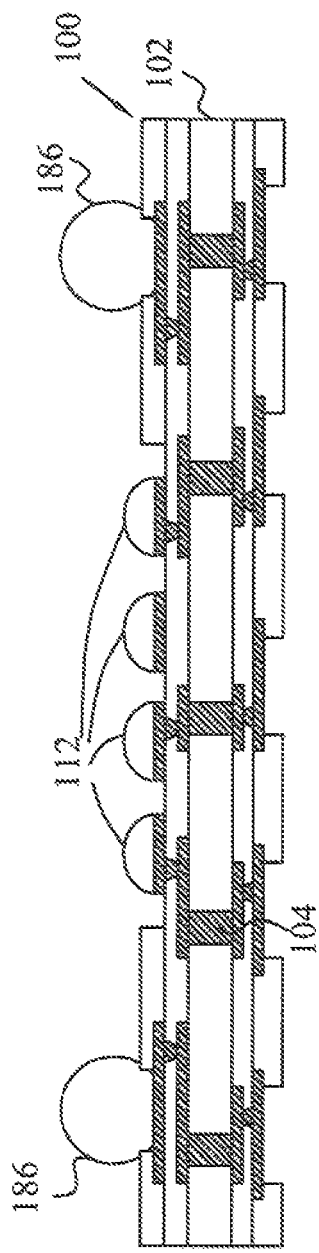
FIGS. 5A-5D are cross sectional views showing various stages of a method of fabricating a System in Package according to a third embodiment.

In FIG. 5A, the package substrate 100 of FIG. 1A is provided, and solder balls 186, copper posts or conductive spacers are joined to the contacts 110 of edge portions 101a-101d of the substrate 100. For example, solder balls 186 may be reflowed to join them to the contacts 110.

Figure 5B:
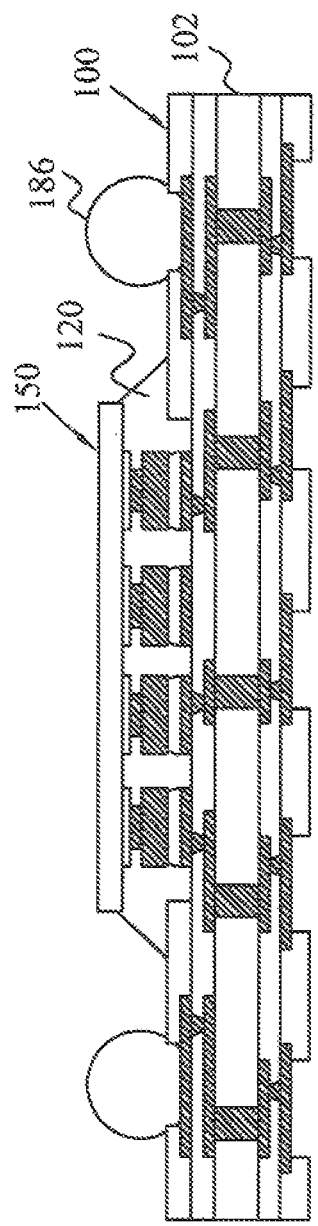

In FIG. 5B, the substrate 150 is placed over the package substrate. The assembly is heated so the solder balls 112 reflow to join the pads of the substrate 150 to the package substrate 100. The assembly is flushed to remove any solder paste, and the first underfill material 120 is flowed into the space between the package substrate 100 and the substrate 150.

Figure 5C:
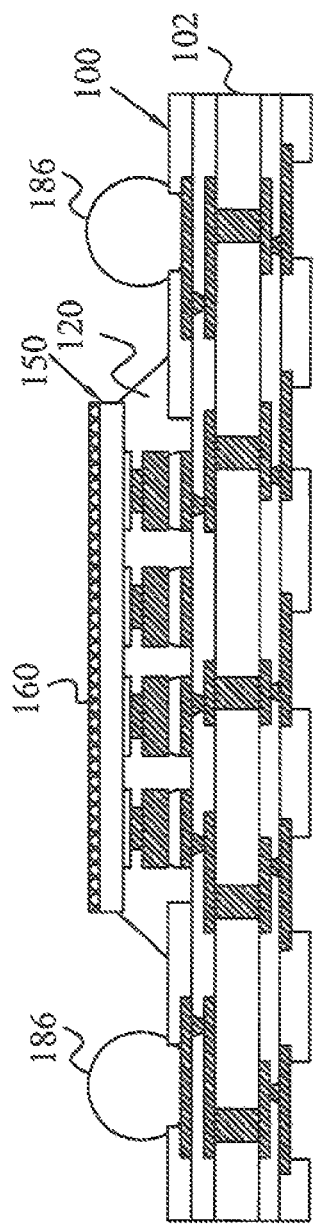

FIG. 5C shows the assembly after the TIM 160 is deposited on the back face of the substrate 150. The TIM 160 may be deposited using the methods described above.

Figure 5D:
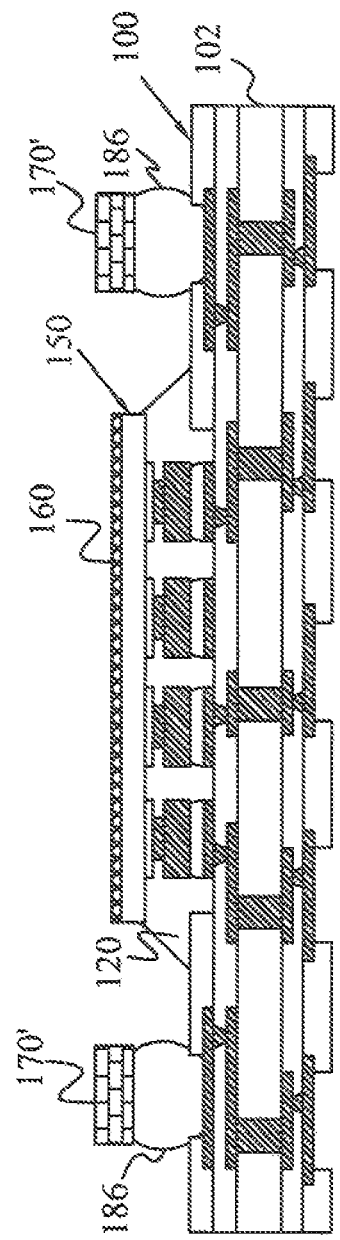

In FIG. 5D, the solder paste 170' is applied over the solder balls 186, for example by printing. The resulting configuration is the same as shown in FIG. 4C.

Following application of solder paste, the upper die packages are placed and connected to the assembly as shown and described with reference to FIG. 4D. Then the package is encapsulated by molding compound (as shown and described with reference to FIG. 2E), and the package is optionally thinned as shown and described above with reference to FIG. 2F.

FIGS. 6A to 6F show another variation of the assembly method.

Figure 6A:
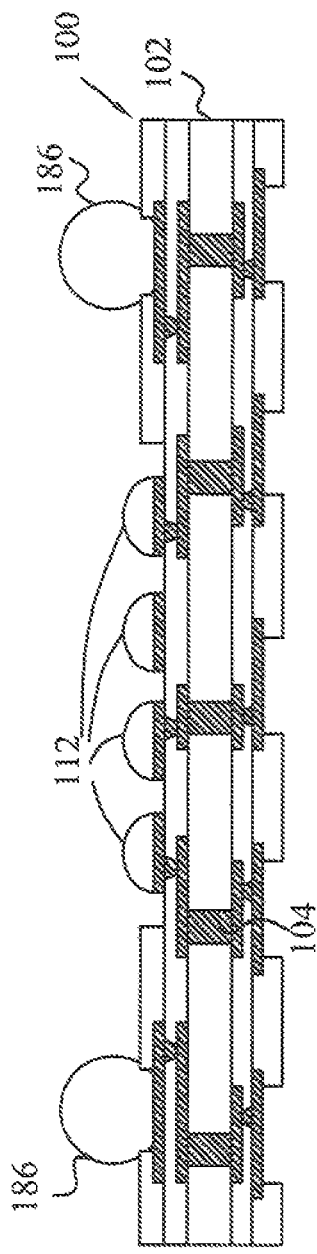
FIGS. 6A-6F are cross sectional views showing various stages of a method of fabricating a System in Package according to a fourth embodiment.

In FIG. 6A, the substrate 100 has solder balls 186 joined as shown and described above with reference to FIG. 5A.

Figure 6B:
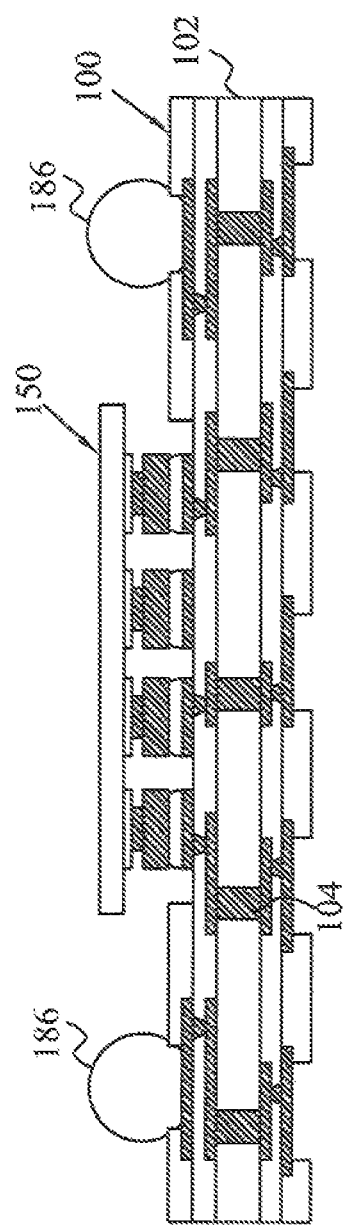

In FIG. 6B, the substrate 150 is placed over the package substrate 100 and the solder balls 112 are reflowed to electrically and mechanically connect the dies 154 of substrate 150 to the package substrate 100. In this embodiment, no underfill is separately applied between the package substrate 100 and the substrate 150 before applying the molded underfill material to the entire package.

Figure 6C:
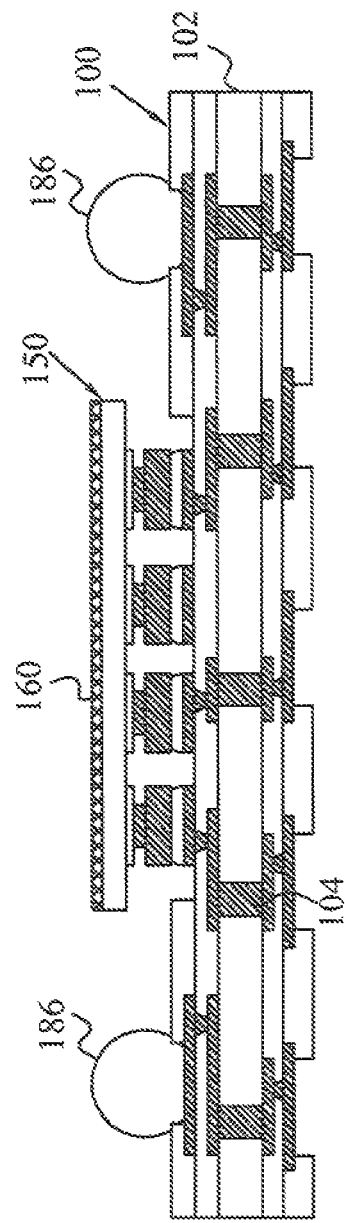

In FIG. 6C, the TIM 160 is deposited over the back face of the substrate 150. The technique for depositing the TIM 160 may be the same as described above with reference to the other embodiments.

Figure 6D:
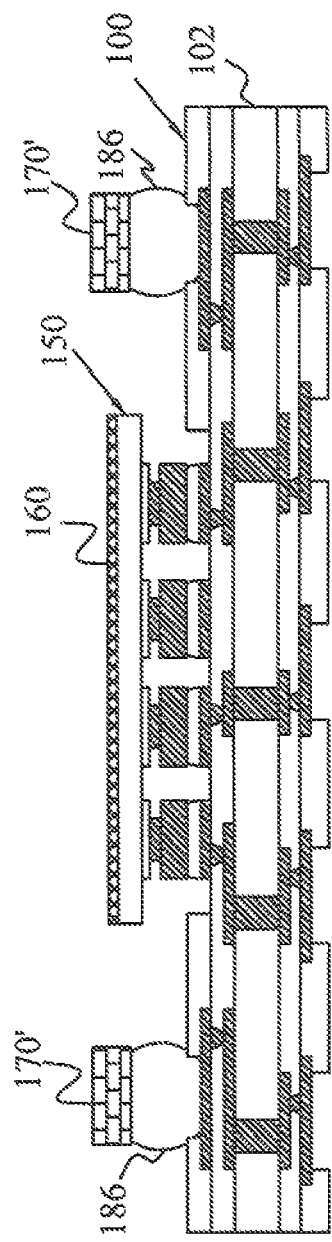

In FIG. 6D, the solder paste 170' is printed on the solder balls 186.

Figure 6E:
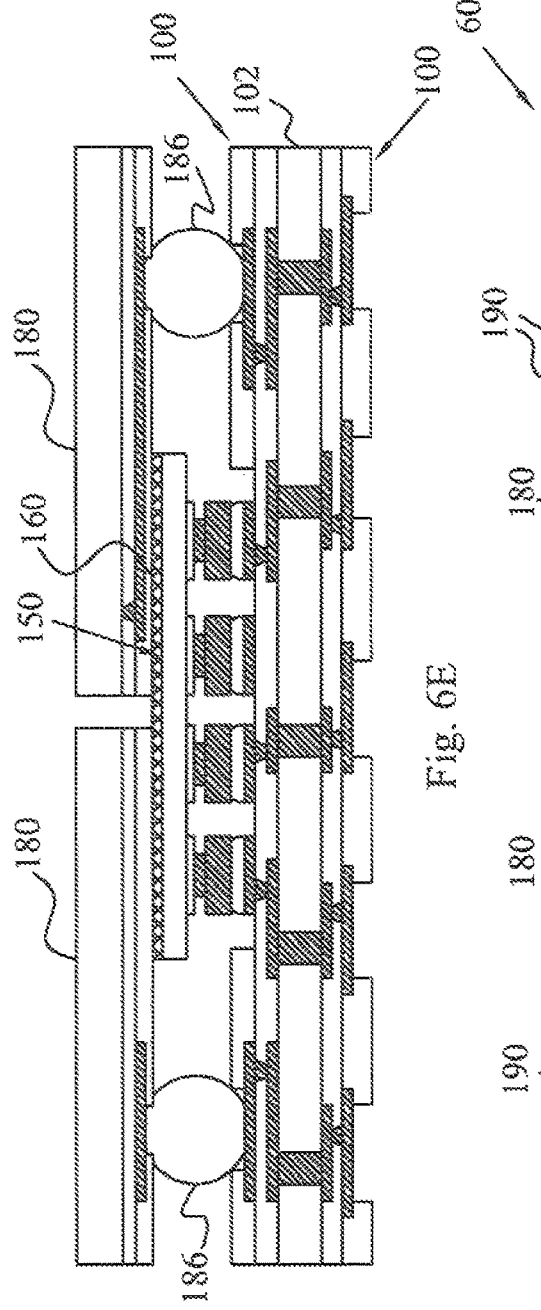

In FIG. 6E, the upper die packages 180 are mounted on the TIM 160. The solder balls 186 are reflowed to electrically and mechanically connect the pads 183 of the upper die packages 180 to the contacts 110 of edge portions 101a-101d of the package substrate 100. The assembly is then flushed with deionized water to remove any remaining solder paste.

Figure 6F:
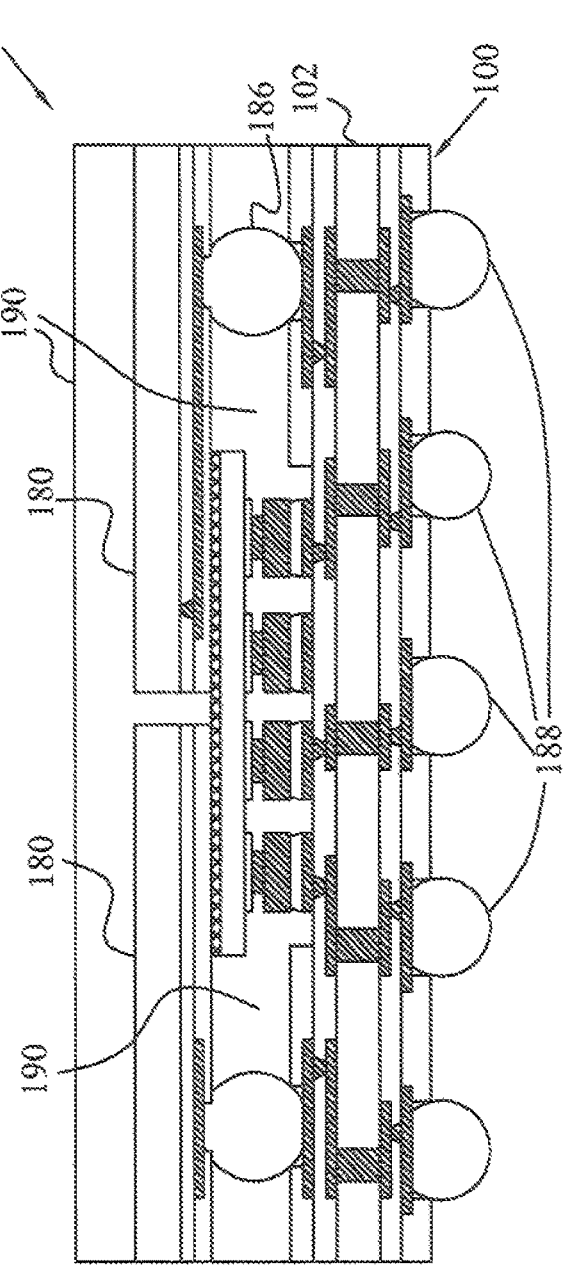

In FIG. 6F, the molded underfill material 190 is inserted between the package substrate 100 and the substrate 150, between the package substrate 100 and the upper die packages 180, and over the upper die packages, to form the package 600. Thus, a single underfill step is used, and this embodiment of the method eliminates a step of applying first underfill 120 beneath the substrate 150 before the upper die packages 180 are connected. In some embodiments, the underfill material 190 above the upper die packages 180 is then removed, and additional thinning may optionally be performed to remove material from the back side of the upper die packages.

In some embodiments, a method comprises connecting a substrate having a plurality of integrated circuit (IC) dies to a package substrate, so that the package substrate extends beyond at least two edges of the substrate, leaving first and second edge portions of the package substrate having contacts thereon exposed. The first and second edge portions meet at a first corner of the package substrate. At least a first upper die package is placed over the substrate, so that first and second edge portions of the first upper die package extend beyond the at least two edges of the substrate. Pads on the first and second edge portions of the first upper die package are connected to the contacts of the first and second edge portions of the package substrate.

In some embodiments, an integrated circuit (IC) package comprises a substrate having a plurality of IC dies connected to a package substrate, so that first and second edge portions of the package substrate extend beyond at least two edges of the substrate. The first and second edge portions meet at a first corner of the package substrate. At least a first upper die package is positioned over the substrate, so that first and second edge portions of the first upper die package extend beyond the at least two edges of the substrate. The first upper die package has pads on the first and second edge portions thereof. The pads are connected to the contacts of the first and second edge portions of the package substrate by solder.

In some embodiments, an integrated circuit (IC) package comprises a substrate having a plurality of IC dies connected to a package substrate, so that four edge portions of the package substrate having contacts thereon extend beyond respective edges of the substrate. Each pair of adjacent edge portions meet at a respective corner of the package substrate. A plurality of upper die packages are positioned so as to partially overlie the substrate, so that first and second edge portions of each upper die package extend beyond a respective pair of adjacent edges of the substrate. The plurality of upper die packages have pads on the first and second edge portions thereof. The pads are connected to respective ones of the contacts of the package substrate by solder. A thermal interface material is provided between the substrate and the plurality of upper die packages.

In some embodiments, an integrated circuit (IC) package comprises a substrate having a plurality of bottom dies connected to the substrate, so that first and second connecting portions of the substrate extend beyond at least two edges of each bottom die, the first and second connecting portions meeting at a first corner of each bottom die. at least a first upper die package is positioned over at least one of the bottom dies, so that first and second edge portions of the first upper die package extend beyond the at least two edges of at least one of the bottom dies. The first upper die package has pads on the first and second edge portions thereof. The pads are connected to the contacts of the first and second connecting portions of the substrate by solder.

Although the subject matter has been described in terms of exemplary embodiments, it is not limited thereto. Rather, the appended claims should be construed broadly, to include other variants and embodiments, which may be made by those skilled in the art.

What is claimed is:

1. An integrated circuit (IC) package, comprising:
an IC die connected to a package substrate, so that four edge portions of the package substrate extend beyond four respective edges of the IC die, adjacent pairs of the four edge portions near respective corners of the IC die;
at least three upper die packages, the at least three upper die packages positioned over the IC die, with a portion of each respective upper die package covering a respective corner portion of the IC die and the IC die located between the at least three upper die packages and the package substrate, first and second ones of the at least three upper die packages being side-by-side, and a third one of the at least three upper die packages diagonally opposite the first upper die package, wherein a portion of the IC die is not covered by any of the at least three upper die packages, and first and second edge portions of each respective upper die package extend beyond two respective edges of the IC die, each of the at least three upper die packages having pads on the respective first and second edge portions thereof, the pads directly connected to contacts of the respective edge portions of the four edges of the package substrate by solder, each respective upper die package comprising a corner that aligns with a respective corner of the package substrate, wherein the first and second ones of the at least three upper die packages extend from the respective corner of the package substrate for a same distance along a first edge of the package substrate and the second and third ones of the at least three upper die packages extends from the respective corner of the package substrate for different distances along a second edge of the package substrate.

2. The IC package of claim 1, wherein the package substrate extends beyond third and fourth edges of the IC die opposite at least two edges of the IC die, further comprising
a fourth upper die package over the IC die, having third and fourth edge portions of the fourth upper die package extending beyond third and fourth edges of the IC die, the third and fourth edge portions of the fourth upper die package having pads connected to the contacts of the third and fourth edge portions of the package substrate.

3. The IC package of claim 1, further comprising
a molded underfill material around the solder and above the first upper die package.

4. The IC package of claim 3, wherein the molded underfill material is further provided in a region between the IC die and the package substrate.

5. The IC package of claim 1, further comprising:
a first underfill material between the IC die and the package substrate; and
a molded underfill material around the solder and above the first upper die package.

6. The IC package of claim 1, wherein each respective upper die package includes a die from the group consisting of: a general purpose processor, a graphics processor, an audio/video processor, a digital radio receiver, dynamic random access memory (DRAM), static random access memory (SRAM), flash memory, a communications processor, a global positioning satellite (GPS) receiver, and a power management unit.

7. The IC package of claim 1, wherein the at least three upper die packages are wafer level chip scale packages.

8. The IC package of claim 1, wherein a molded underfill material abuts the solder.

9. The IC package of claim 8, wherein the molded underfill material is in a region between the IC die and the package substrate.

10. The IC package of claim 1, further comprising a thermal interface material between the IC die and each respective upper die package.

11. The IC package of claim 10, wherein the thermal interface material is a polyimide.

12. The IC package of claim 1, wherein the IC die is laterally surrounded by solder balls.

13. The IC package of claim 1, wherein the package substrate comprises a dielectric layer.

14. The IC package of claim 1, wherein the first and third ones of the at least three upper die packages comprise a same area.

15. The IC package of claim 1, wherein the first and third ones of the at least three upper die packages comprise different areas.

16. The IC package of claim 1, wherein the second and third ones of the at least three upper die packages are side-by-side.

17. An integrated circuit (IC) package, comprising:
an IC die connected to a package substrate, so that first and second edge portions of the package substrate extend beyond at least two edges of the IC die, the first and second edge portions of the package substrate meeting at a first corner of the package substrate adjacent to a first corner of the IC die;
at least a first upper die package, the first upper die package positioned over the IC die, with a portion of the first upper die package covering a first portion of the IC die, wherein a second portion of the IC die is not covered by the first upper die package, and first and second edge portions of the first upper die package extend beyond the at least two edges of the IC die,
the first upper die package having pads on the first and second edge portions thereof, the pads connected to contacts of the first and second edge portions of the package substrate by solder
a second upper die package, the second upper die package over the IC die, having third and fourth edge portions of the second upper die package extending beyond third and fourth edges of the IC die, the third and fourth edge portions of the second upper die package having pads connected to the contacts of the third and fourth edge portions of the package substrate and
a third upper die package, the third upper die package over the IC die, having fifth and sixth edge portions of the third upper die package extending beyond the second and third edges of the IC die, the fifth and sixth edge portions of the third upper die package having pads connected to the contacts of the second and third edge portions of the package substrate,
wherein each of the first upper die package, the second upper die package, and the third upper die package comprises a corner that overlays a respective corner of the package substrate, wherein the first upper die package and the second upper die package extend from the respective corner of the package substrate for a same distance along a first edge of the package substrate and the second upper die package and the third upper die package extends from the respective corner of the package substrate for different distances along a second edge of the package substrate.

18. The IC package of claim 17, further comprising
a fourth upper die package over the IC die, having seventh and eighth edge portions of the fourth upper die package extending beyond the first and fourth edges of the IC die, the seventh and eighth edge portions of the fourth upper die package having pads connected to the contacts of the first and fourth edge portions of the package substrate.

19. The IC package of claim 18, wherein
the first, second, third and fourth upper die packages are wafer level chip scale packages.

20. An integrated circuit (IC) package, comprising:
a plurality of IC dies connected to a package substrate on a first side of the package substrate, so that four edge portions of the package substrate having contacts thereon extend beyond respective edges of one of the plurality of IC dies, each pair of adjacent edge portions near a respective corner of the one of the plurality of IC dies;

at least three upper die packages on the first side of the package substrate, the one of the plurality of IC dies having three respective upper die packages covering three respective corner portions of the one of the plurality of IC dies so as to partially overlie the one of the plurality of IC dies, first and second ones of the at least three upper die packages being side-by-side, and a third one of the at least three upper die packages diagonally opposite the first upper die package, so that first and second edge portions of each respective upper die package extend beyond a respective pair of adjacent edges of the one of the plurality of IC dies, and a second portion of the one of the plurality of IC dies is not covered by any of the respective upper die packages, the one of the plurality of IC dies located between the at least three upper die packages and the package substrate, each of the at least three upper die packages having pads on the first and second edge portions thereof, each respective pad directly connected to a respective one of the contacts of the package substrate by solder; and a thermal interface material between the one of the plurality of IC dies and the at least three upper die packages, wherein each respective upper die package comprises a corner that aligns with a respective corner of the package substrate, wherein the first and second ones of the at least three upper die packages extend from the respective corner of the package substrate for a same distance along a first edge of the package substrate and the second and third ones of the at least three upper die packages extends from the respective corner of the package substrate for different distances along a second edge of the package substrate.

\* \* \* \* \*